United States Patent [19]
Strandberg et al.

[11] Patent Number: 6,147,877
[45] Date of Patent: Nov. 14, 2000

[54] DEVICE FOR TRANSFERRING ELECTRIC SIGNALS

[75] Inventors: Lars Strandberg, Våsterås; Erki Kurttila, Gävle, both of Sweden

[73] Assignee: Asea Brown Boveri AB, Vasteras, Sweden

[21] Appl. No.: 09/171,636

[22] PCT Filed: Apr. 16, 1997

[86] PCT No.: PCT/SE97/00636

§ 371 Date: Oct. 22, 1998

§ 102(e) Date: Oct. 22, 1998

[87] PCT Pub. No.: WO97/40550

PCT Pub. Date: Oct. 30, 1997

[30] Foreign Application Priority Data

Apr. 23, 1996 [SE] Sweden ................................. 9601533

[51] Int. Cl.$^7$ ........................................................ H05K 7/14
[52] U.S. Cl. ...................... 361/784; 361/785; 361/725; 361/686; 439/259; 439/928.1
[58] Field of Search ..................... 361/784, 785, 361/736, 725, 729, 683, 686; 439/74, 259, 928.1

[56] References Cited

U.S. PATENT DOCUMENTS

| | | | |
|---|---|---|---|
| 3,942,077 | 3/1976 | Powers | 361/686 |
| 4,558,914 | 12/1985 | Prager et al. | 439/259 |
| 4,738,632 | 4/1988 | Schmidt et al. | 439/341 |
| 4,967,311 | 10/1990 | Ferchau et al. | 361/736 |
| 5,043,847 | 8/1991 | Deinhardt et al. | 361/736 |
| 5,065,141 | 11/1991 | Whitsitt | 340/635 |
| 5,329,428 | 7/1994 | Block et al. | 361/785 |

FOREIGN PATENT DOCUMENTS

| | | |
|---|---|---|
| 0 038 607 A2 | 10/1981 | European Pat. Off. . |
| WO 93/06636 | 4/1993 | WIPO . |

*Primary Examiner*—Jeffrey Gaffin
*Assistant Examiner*—David Foster
*Attorney, Agent, or Firm*—Pollock, Vande Sande & Amernick, R.L.L.P.

[57] ABSTRACT

A device for transferring electric signals comprises a first unit having a bus and electrical and mechanical interconnections of this bus and a bus of another device at at least one side of the unit. A second unit has terminals electrically connected to the bus for external connection of the device to, and signal exchange with, electrical arrangements. The device further comprises two different carriers on which the bus unit and the terminal unit, respectively, are arranged, and members for releasable mechanical connection of the two carriers to each other, and adapted to allow separation of the terminal unit from the bus unit with maintained connection thereof to the bus unit of an adjacent device.

15 Claims, 4 Drawing Sheets

DEVICE FOR TRANSFERRING ELECTRIC SIGNALS

FIELD OF THE INVENTION

The present invention relates to a device for transferring electric signals comprising, on one hand, a first unit having a bus and means for electrically and mechanically interconnecting this bus and a bus of a similar device at at least one side of the unit, and, on the other hand, a second unit having terminals electrically connected to a bus and adapted for external connection of the device to and signal exchange with electrical arrangements.

BACKGROUND OF THE INVENTION

Such devices may be of most different types and used for different types of signal transmission, both of numerical and analog character, said signals arriving to the bus of the device from, for example, a central unit or other devices as well as to the terminals from different electrical arrangements. The signals also travel in the opposite direction for bidirectional communication. A signal adapting module is then preferably arranged between the units for adapting signals. By way of example it may be mentioned that analog signals arriving to the bus of the device may be measuring signals from any pressure, temperature or flow sensor, and an analog output signal may then be sent to the terminals for controlling a regulator, for instance a valve regulating a flow, or a member regulating the temperature of an oven. The signals arriving to the bus of the device through the terminals may, in the numerical case, derive from contactors or similar electrical components, while the returning signals may control for example a motor through a contactor. The bus may also enable communication between different devices interconnected and a central unit. Furthermore, the device or the electrical arrangements connected thereto may receive their power supply through the bus. Devices of this type are fixedly interconnected, i.e. mechanically interconnected, through means, which in prior art devices resulted in considerable problems when any part of any device had to be repaired. In such a case the entire device had in the prior art devices to be separated from adjacent devices through disconnecting the means, thus breaking the continuity of the bus extending through the devices. This problem with known devices is schematically illustrated in FIGS. 1 and 2. Different devices 1' are connected to each other through co-operating assembling means 2', 3' at the respective device bus inlet 4' and bus outlet 5'. A series of devices 1' are in this way closely connected to each other side by side and preferably arranged on a mounting rail of a frame or the like. Such a device 1' comprises, as mentioned in the introduction, a bus unit as well as a terminal unit electrically connected thereto, which also are arranged as a continuous unit. These units may have an arbitrary content of signal adapting components and terminals. If a need of a replacement or repair of a device arises, a device having other devices on both sides thereof, as for example, the second device seen from the left in FIG. 1, the devices on both sides thereof are to be displaced to the left and to the right, respectively, as illustrated in FIG. 2, by a sufficient distance for creating such a gap that a separation of interconnecting means 2' and 3' of the buses may take place, and the device or the module may then be removed. This operation has to take place un the opposite order when a new device is to be inserted between other devices. This mode of changing devices when required is of course a drawback, since the very exchange is burdensome, requiring a displacement of the devices in one direction for creating a space for replacing a device. This means that in most cases a larger number of devices have to be displaced when one single device is to be exchanged, and such a displacement is troublesome since most of the devices carry terminations for cables to electrical arrangements. Furthermore, space has to be provided for such displacements of the devices, which means that they may not be arranged at such a high density as desired.

A considerable disadvantage of these prior art devices consists in the fact that entire devices have to be removed also if there is only a mechanical damage of any of the terminals thereof and this has to be repaired.

SUMMARY OF THE INVENTION

The object of the present invention is to provide a device of the type defined in the introduction, which to a large extent reduces the disadvantages mentioned above of such already known devices.

According to the present invention, the above object is obtained by providing a device, which comprises two different carriers, onto which the bus unit and terminal unit are arranged, and members for releasable mechanical connection of the two carriers to each other, the members being adapted to allow separation of the terminal unit from the bus unit with maintained interconnection of the latter with the bus unit of an adjacent device.

Due to a division of the bus unit and the terminal unit on carriers separable from each other, it is possible to remove the terminal unit from the device by simply releasing the mechanical connection to the carrier of the bus unit established by the members and accordingly without any necessity to carry out any displacement whatsoever of adjacent devices. Also, usually the parts arranged on the terminal unit are those parts to be repaired occasionally, mostly as a consequence of their exposure to mechanical damage. Thus, it is possible to remove exactly that part of the device that needs to be repaired and maintain the continuity of the bus interconnecting adjacent devices, the bus being arranged on a unit needing repair very seldom.

According to a preferred embodiment of the invention the bus unit has a flat extension substantially according to a first plane substantially parallel to which the bus extends and in which the means are adapted to carry out the interconnection. The members are adapted to establish a mechanical connection of the two carriers in a direction extending in a second plane extending substantially perpendicularly to said the plane for removing the terminal unit from the bus unit by lifting a carrier of the terminal unit away from the carrier of the bus unit in this direction after released connection. By such a construction of the members, the carrier carrying the terminal unit may be separated from the carrier carrying the bus unit without striking parts of adjacent devices during this separation movement.

According to another preferred embodiment of the invention the members are adapted to establish a mechanical interconnection of the two carriers in a direction substantially perpendicular to the first plane. By providing possibility to separate the two carriers in this direction the terminal unit may easily be separated and removed from the bus unit for repair. Then, there is no risk that a cable channel running below or above a row of devices constitutes an obstacle to such a separation movement.

According to another preferred embodiment of the invention the bus unit carrier forms a bottom part of the device intended to be secured to a frame, a mounting rail or the like, and a terminal unit carrier forms a top part mechanically connectable onto the bottom part. By such a construction of the device with the carrier being removable without breaking the bus connection between adjacent devices and without any requirement of displacement of adjacent devices, the bus unit located there behind, will be protected so that possible mechanical damage of the device may only arise on the terminal unit so removable and the carrier therefore.

According to another preferred embodiment of the present invention the device comprises a signal adapting module adapted to electrically connect the units to each other by being connectable to the bus through one connection and being connectable the terminals through another connection. Such a signal adapting module is advantageously used for establishing the electrical connection between the bus unit and the terminal unit so as to ensure a suitable adaptation of the signals arriving thereto with respect to their representation on the bus and at the terminals.

According to another preferred embodiment of the invention the signal adapting module is arranged on the top part and separable therefrom in the same direction as the top part is separable from the bottom part. Through such a separation of the signal adapting module the terminal unit is easily accessible, and maintenance work on these both parts may be carried out separately.

According to another preferred embodiment of the invention the members for creating a mechanical connection between the carriers are adapted to do this through a snap-in connection member. By arranging connecting members of this type between the carriers, carrying the two units, the two carriers and thus, the units, may easily and quickly be separated from each other.

Further advantages and preferred characteristics of the invention will appear from the following description.

BRIEF DESCRIPTION OF THE DRAWINGS

With reference to the appended drawings, below follows a specific description of embodiments of the invention cited as examples.

In the drawings.

DETAILED DESCRIPTION OF PREFERRED EMBODIMENTS OF THE INVENTION

Figure 1:
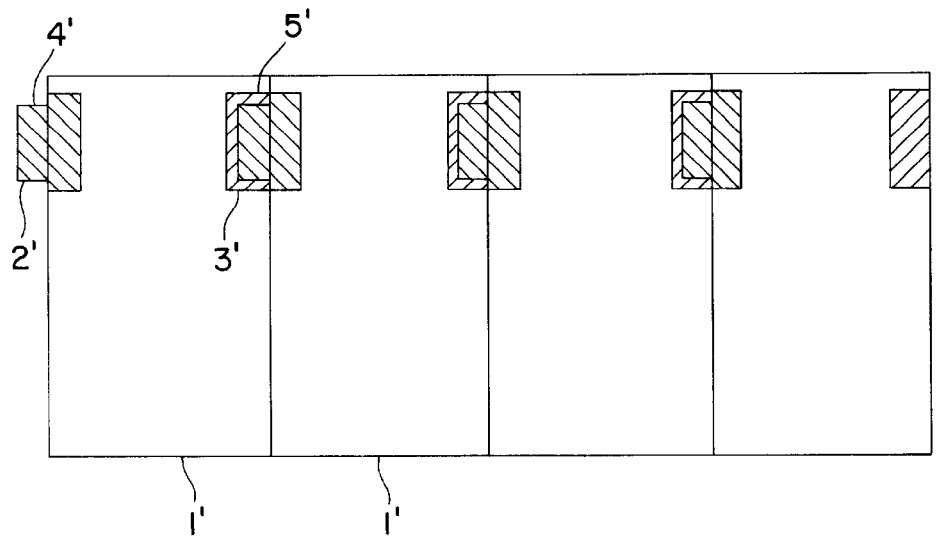
FIGS. 1 and 2 are schematic and simplified views illustrating how devices according to the prior art are interconnected and how they may be separated from each other for replacement.
Figure 2:
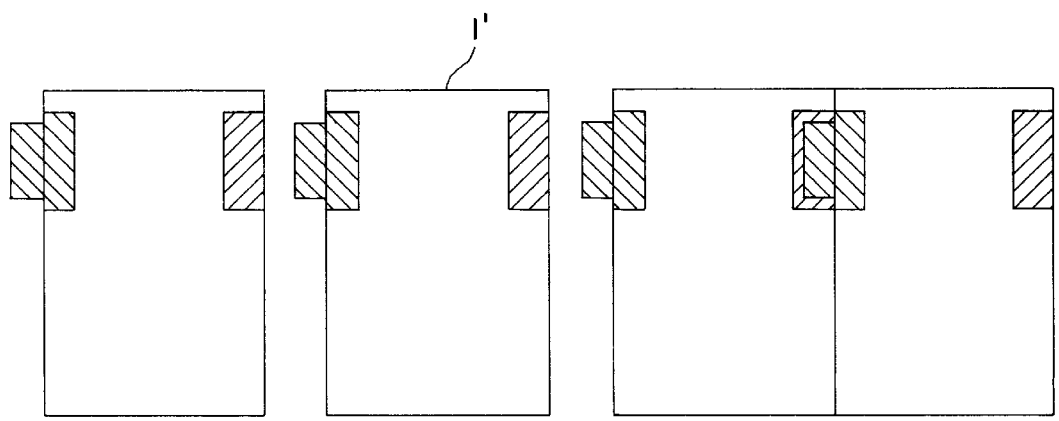
Figure 3:
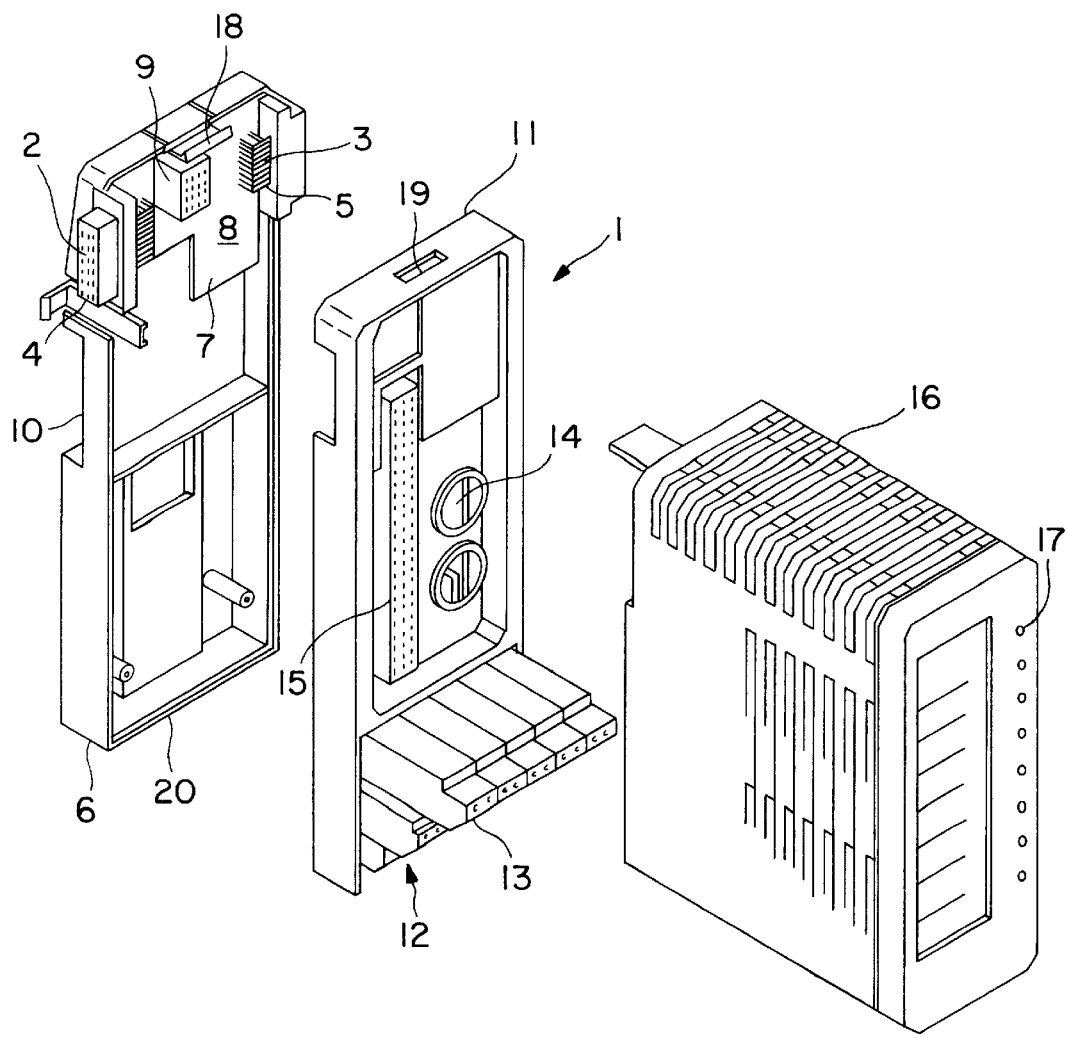
FIG. 3 is an exploded perspective view illustrating the construction of a device according to a first preferred embodiment of the invention and how the parts thereof may be separated from each other.

FIG. 3 is an exploded view illustrating how a device 1 for transferring electric signals according to a first, preferred embodiment of the invention is constructed. The device has a first frame-like carrier 6, which preferably is made of plastic material, for carrying a first unit 7 having a bus with bus connections 4 and 5, which in a conventional way have female and male engagement means 2, 3 co-operating with each other for electrical and mechanical connection of this bus and buses of similar devices on both sides of this unit. The first unit 7 has the different components thereof carried on the printed circuit card 8, on which electrical connections required therebetween are carried out. The circuit card is removably secured to the carrier 6, preferably by a simple snap-in connection member or the like. The printed circuit card 8 also carries conventional means 9 for electrically connecting the bus 4, 5 to a signal adapting module and therethrough to a terminal unit being part of the device in a way to be describe further on. The carrier 6 with the unit 7 may be considered as a bottom part of the device, and the carrier 6 has on the rear side thereof a recess 10 for securing the device to a conventional mounting rail.

The device further comprises a second carrier 11, which is preferably also made of plastic material and is adapted to carry a second unit 12, which may be secured to this carrier in a similar way as the first unit is secured to the first carrier. However, the second unit is introduced into the second carrier from the opposite direction then the first unit 7 in the first carrier 6 in the positions they have in FIG. 3. The second unit 12 is a terminal unit and has a number of conventional terminals 13 or connection blocks for external connection of the device to, and signal exchange with different electrical arrangements or equipment. The expression "signal exchange" also comprises a supplying these arrangements with current. The second unit 12 also has a printed circuit card 14, which may be seen through openings of the carrier 11. The terminals 13 and conventional connection means 15 are arranged on the printed circuit card 14 for connection of the second unit 12 to a signal adapting module and therefore also to the bus. Thus, the connection means 15 and the terminals 13 are electrically connected through conducting paths arranged on the printed circuit card 14. It is also conceivable to arrange different electrical components, such as switches, circuit breakers and different condition components on the printed circuit card, but the printed circuit card and therefore the device will then require a larger surface.

The device has also a signal adapting module 16 indicated through the casing thereof, which is also called an I/O module (input/output module). When the device is assembled, module 16 is arranged to electrically connect the bus to the terminals by being connected to the connecting means 9 of the bus unit at the signal inlet thereof and the connecting means 15 of the terminal unit at the signal outlet thereof. The connection allows signal exchange to take place, although galvanic separation may be present. A The signal adapting module is thus arranged to carry out a suitable adapting of the signals arriving thereto through the bus and the terminal unit. This module has light diodes 17 indicating the function thereof.

The device has also members for releasable mechanical connection of the two carriers 6 and 11 to each other, which are adapted to allow separation of the terminal unit from the bus unit with maintained interconnection thereof and of a bus unit of an adjacent device through the means 2, 3, such as will be explained further on while referring to FIG. 4. These members are in an advantageous way in the present case formed by snap-in connection members, a male member 18 being arranged on the upper part of the carrier 6 and a corresponding recess 19 being arranged in the upper part of the carrier 11. The carriers have on their lower parts corresponding snap-in members in the form of a rim 20 (see FIG. 3) of the first carrier 6 and members snapping in therebehind when the carriers are pressed against each other, more exactly two such members, of the lower part of the second carrier 11. However, these members having a conventional design are not shown in the figures. Thus, an easy assembly of the two carriers is obtained by simply pressing them against each other so that the different snap-in locks are activated. The removal is nearly just as easily accomplished by introducing a suitable object in the recess 19 for pressing the member 18 downwardly, whereupon the carrier 11 may be pivoted out from the carrier 6 about the lower end thereof. Securing of the signal adapting module 16 to the device may be achieved by connection of the connection means 9 and 15 but it may be supplemented by further mechanical connecting members.

Figure 4:
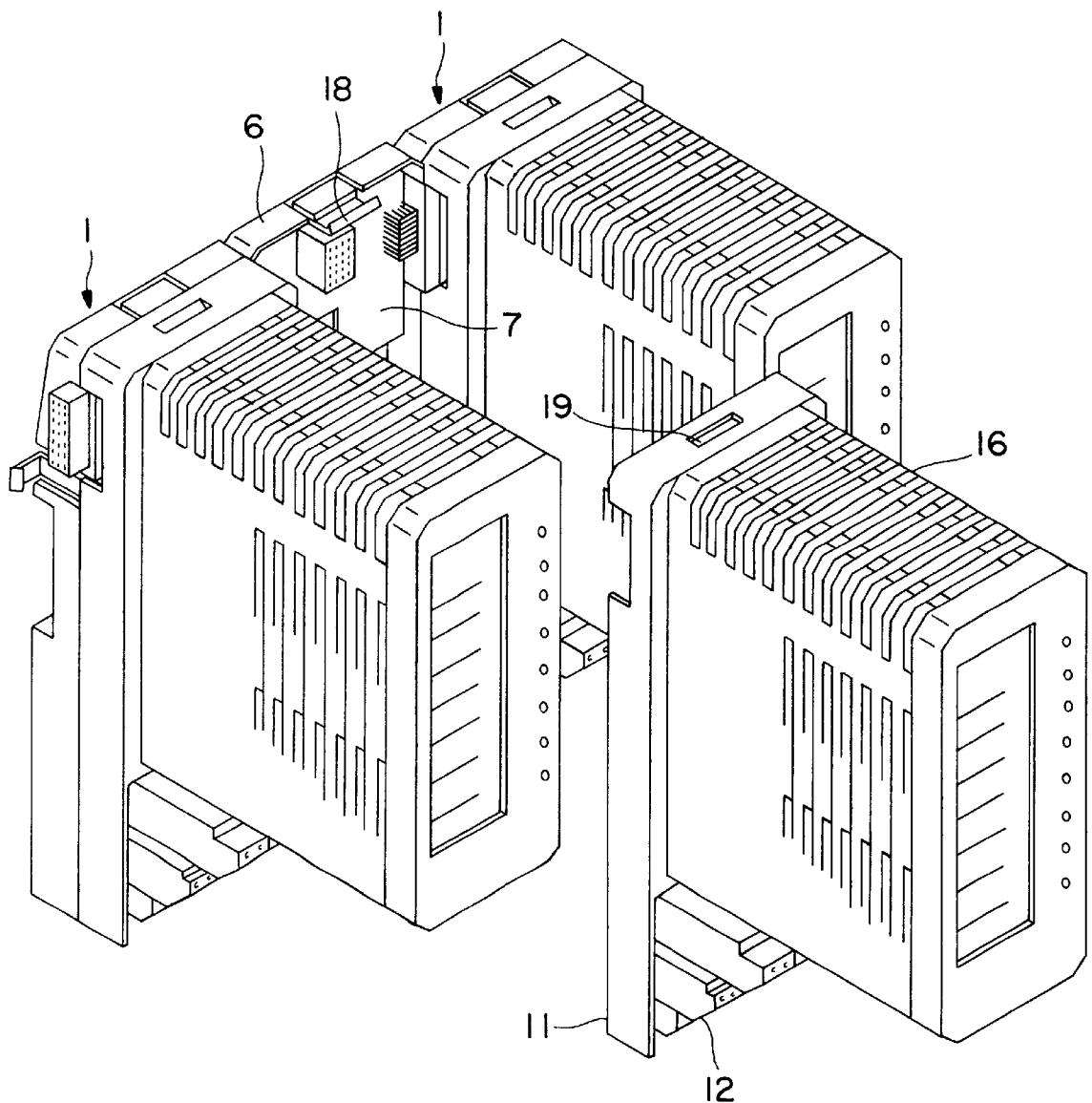
FIG. 4 is a perspective view of three devices according to FIG. 3 arranged side by side and connected to each other, and it is illustrated how a termination unit with carrier and signal adapting module may be removed from the middle device.

It is illustrated in FIG. 4 how maintenance work is facilitated by the invention on parts having, for instance, been subjected to any mechanical damage by being struck unintentionally by anyone, for instance by a tool. Through the design of the present invention, the carrier 11 with the terminal unit when arranged with the terminal unit in front of or on top of the carrier 6 with the bus unit, will function as 2 protection for damage from outside of the components of the carrier 6, so that there will be no risk that these components on the carrier 6 may be damaged by such influence. Accordingly, when a need of exchange or repair arises it is almost always only necessary to remove the carrier 11 with the terminal unit 12 from the carrier 6. This may be done without breaking the continuity of the bus running through adjacent devices and without in any way having to influence adjacent devices. The separation is simply obtained by first of all lifting the signal adapting module 16 away from the rest of the device in a direction substantially perpendicular to a plane, substantially parallel to which the bus extends. The mechanical connection established by the members 18–20 between the carrier 6 and 11 is thereafter released and the carrier 11 with terminal unit 12 carried thereby is lifted away in the same direction as the signal adapting module from the carrier 6. In FIG. 4, for space reasons, it is indicated that the signal adapting module and the carrier 11 would be removed at the same time, but the removal in practice takes place just as described. The assembly of the carrier 11 and the terminal unit 12 takes place in the opposite order. By arranging the carriers 6 and 11 with connecting means so that the removal and assembly movement may take place in the above-described direction, the advantage that the cable channel usually being arranged directly under the devices does not constitute any obstacle for the exchange operation is obtained.

Figure 5:
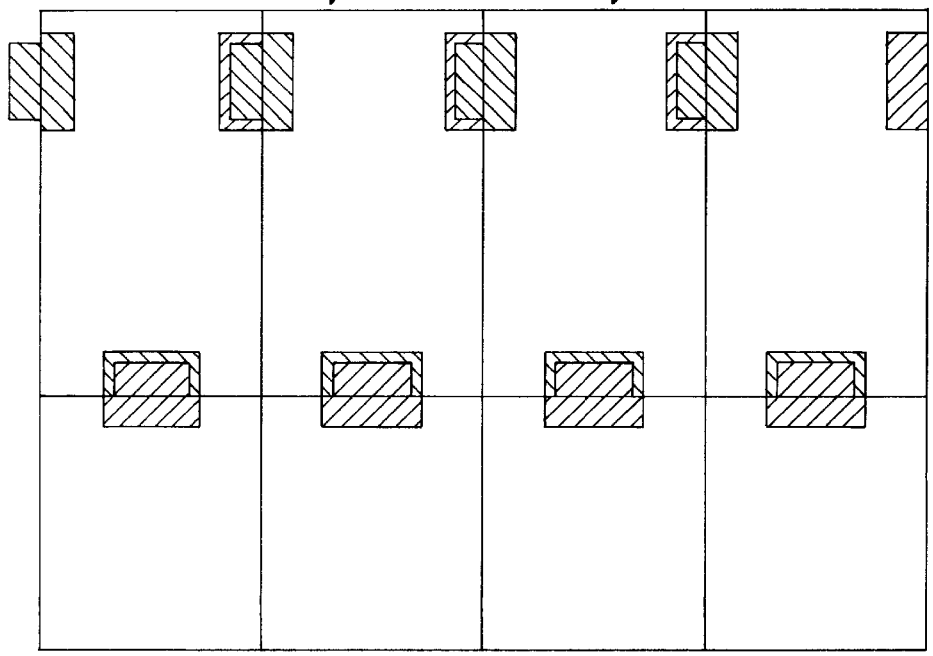
FIGS. 5 and 6 are simplified views illustrating the construction of and how the device according to a second preferred embodiment of the invention may be separated into two parts.
Figure 6:
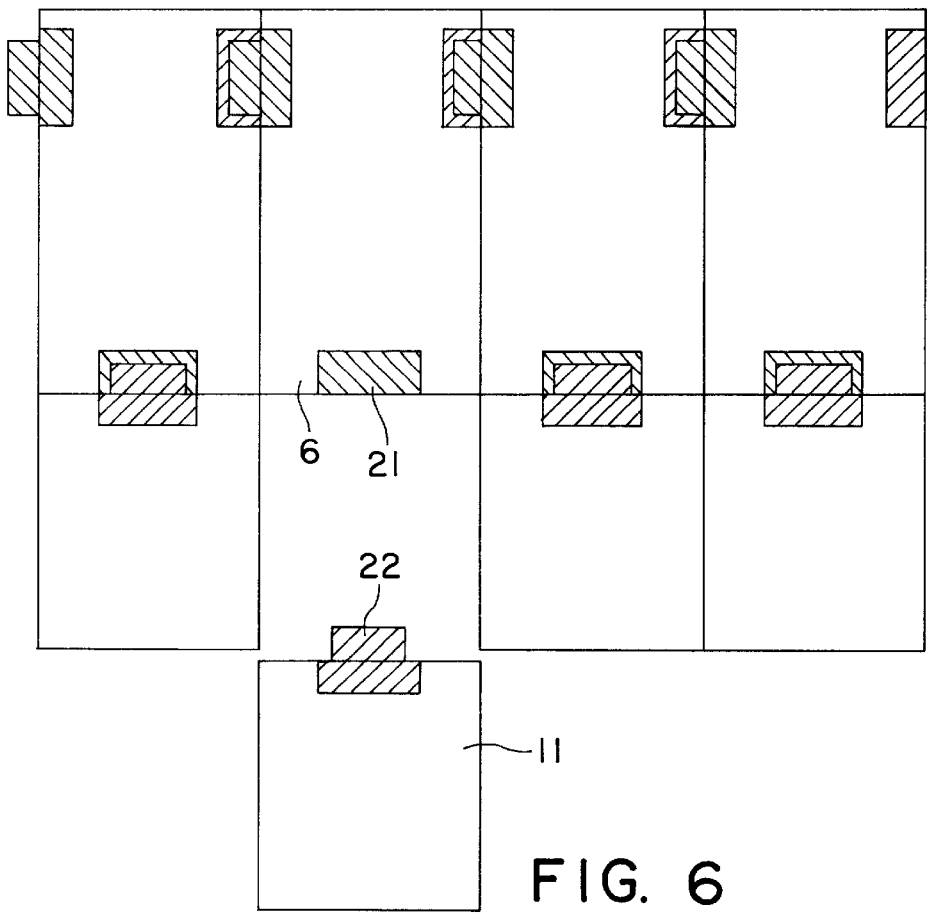

Another possible preferred embodiment of the device according to the present invention is schematically illustrated in FIGS. 5 and 6. Members 21, 22 in this device are arranged to establish a mechanical interconnection of the two carriers 6, 11 in a direction substantially parallel to the first plane mentioned above and perpendicular to the extension of the bus. As illustrated in FIG. 6, the carrier 11 with the terminal unit of a device with other similar devices connected thereto on both sides thereof may in this way be removed from the bus unit of the device without being forced to thereby break the continuity of the bus or in any way displace the other devices. However, this embodiment may result in a certain problem with cable channels running under the devices when carrying out the exchange operation.

The invention is of course not in any way restricted to the preferred embodiments described, but several possibilities to modifications thereof would be apparent to a man with skill in the art without departing from the basic idea of the invention.

The appearance of the different parts included in the device may of course be totally different than shown in the more detailed figures, without departing from the basic idea of the invention. The number of connection blocks of the terminal unit may for example be another, the signal adapting module may have another shape and so on.

It is also conceivable that the members for releasable mechanical connection of the two carriers allow removal thereof in other directions than what is shown through the two embodiments illustrated, as long as a maintained interconnection of the bus unit and bus units of adjacent devices is possible.

"Electrically connected" and "electrically connected" in the claims and in the description are not to be interpreted as an obligation to have a direct electrical connection established, but the parts in question may be galvanically separated from each other. Thus, such a connection means that electric signal may be transported between the electronically-connected parts.

What is claimed is:

1. A device for transferring electronic signals comprising a first unit having a bus and means for electronically and mechanically interconnecting said bus and a bus of another device on at least one side of the first unit, and a second unit having terminals electronically connected to the bus and adapted for external connection of the device to, and signal exchange with, electrical arrangements, wherein said device comprises two different carriers on which said first unit and said second unit are arranged, and members for releasable mechanical connection of the two carriers to each other, said members adapted to allow separation of the second unit from the first unit with maintained interconnection of the first unit with a first unit of an adjacent device through said means.

2. A device according to claim 1, wherein the first unit has a flat extension substantially along a first plane substantially parallel to which said bus extends, and in which said means are adapted to carry out said interconnecting, and wherein said members are adapted to establish a mechanical connection of the two carriers in a direction extending in a second plane extending substantially perpendicularly to said first plane for removing the second unit from the first unit by lifting the carrier of the second unit away from the carrier of the first unit in said direction after said connection is released.

3. A device according to claim 2, wherein said members are adapted to establish a mechanical connection of the two carriers in a direction substantially perpendicular to said first plane.

4. A device according to claim 1, wherein the first unit carrier forms a bottom part of the device for securing onto a frame or mounting rail, and the second unit carrier forms a top part mechanically connectable on top of the bottom part.

5. A device according to claim 4, wherein the terminals are arranged on the second unit carrier so that when the carriers are connected to each other the terminals cover the end of the first unit carrier opposite to the end of the first unit carrier at which the bus is arranged.

6. A device according to claim 2, wherein said members are adapted to establish a mechanical connection of the two carriers in a direction substantially parallel to said first plane.

7. A device according to claim 6, wherein said means for interconnecting the bus and a bus of another device are arranged at a first end of the first unit carrier, and wherein said member is arranged to establish a connection between the two carriers at an opposite end of the bus unit carrier.

8. A device according to claim 1, wherein the first unit has means for electrically and mechanically interconnecting the bus thereof and a bus of another device on both sides of the unit.

9. A device according to claim 1, comprising a signal adapting module arranged to electrically connect the first and second units to each other by being connectable to the bus through one connection and being connectable to the terminals through another connection.

10. A device according to claim 9, wherein the signal adapting module is mechanically and electrically connectable to both said carriers and separable therefrom in a direction substantially perpendicular to a plane along which the two carriers substantially extend.

11. A device according to claim 4, wherein a signal adapting module forms a part for arranging on top of said top part and separable therefrom in the same direction as the top part is separable from the bottom part.

12. A device according to claim 1, wherein said members are adapted to establish a mechanical connection between the carriers through a snap-in connection member.

13. A device according to claim 1, wherein the second unit comprises a printed circuit card electrically connected to the terminals thereof and the bus is arranged on a printed circuit card carried by a carrier, and wherein the device comprises members for electrically interconnecting to the two printed circuit cards.

14. A device according to claim 13, wherein the printed circuit cards are arranged only indirectly in contact with each other.

15. A device according to claim 13, wherein the printed circuit card of the second unit is provided with electrical components.

* * * * *